(12) United States Patent
Abbasi et al.

(10) Patent No.: US 8,384,479 B2
(45) Date of Patent: Feb. 26, 2013

(54) PARTIAL CASCODE IN COMBINATION WITH FULL CASCODE OPERATIONAL TRANSCONDUCTANCE AMPLIFIER

(75) Inventors: Saeed Abbasi, Valley Forge, PA (US); Nima Gilanpour, North York (CA); Vincent Law, Richmond Hill (CA)

(73) Assignees: Advanced Micro Devices, Inc., Sunnyvale, CA (US); ATI Technologies ULC, Markham, Ontario (CA)

( * ) Notice: Subject to any disclaimer, the term of this patent is extended or adjusted under 35 U.S.C. 154(b) by 129 days.

(21) Appl. No.: 12/719,092

(22) Filed: Mar. 8, 2010

(65) Prior Publication Data

US 2011/0215869 A1 Sep. 8, 2011

(51) Int. Cl.
*H03F 3/45* (2006.01)

(52) U.S. Cl. ......................... 330/253; 330/255
(58) Field of Classification Search .............. 330/253, 330/255
See application file for complete search history.

(56) References Cited

U.S. PATENT DOCUMENTS

| | | | |
|---|---|---|---|
| 7,342,418 B2 * | 3/2008 | Moon | 330/253 |
| 7,786,801 B2 * | 8/2010 | Kim | 330/255 |
| 2007/0018699 A1 | 1/2007 | Abbasi | |
| 2007/0216455 A1 | 9/2007 | Abbasi | |
| 2009/0066415 A1 * | 3/2009 | Kim | 330/253 |
| 2010/0033464 A1 * | 2/2010 | Shimatani | 330/253 |

OTHER PUBLICATIONS

"Cascode" from Wikipedia, URL:<http://en.wikipedia.org/wiki/Cascode>, Jan. 11, 2010, 8 pages.
Comer, David J. and Comer, Donald T., Fundamentals of Electronic Circuit Design, May 2002, §§ 9.1, 9.2, pp. 263-292.

* cited by examiner

*Primary Examiner* — Khanh V Nguyen
(74) *Attorney, Agent, or Firm* — Zagorin O'Brien Graham LLP

(57) ABSTRACT

An amplifier circuit includes a first stage and a second stage. The first stage includes a differential input circuit coupled to a differential input node. The first stage includes a first partial cascode circuit including devices of a first type, the first partial cascode circuit being coupled to a first power supply node, a first bias node, and the differential input stage. The first stage includes a second partial cascode circuit including devices of a second type, the second partial cascode circuit being coupled to a second power supply node and the differential input circuit. The second stage is coupled to the first stage. The second stage includes a first full cascode circuit coupled to an output node.

15 Claims, 6 Drawing Sheets

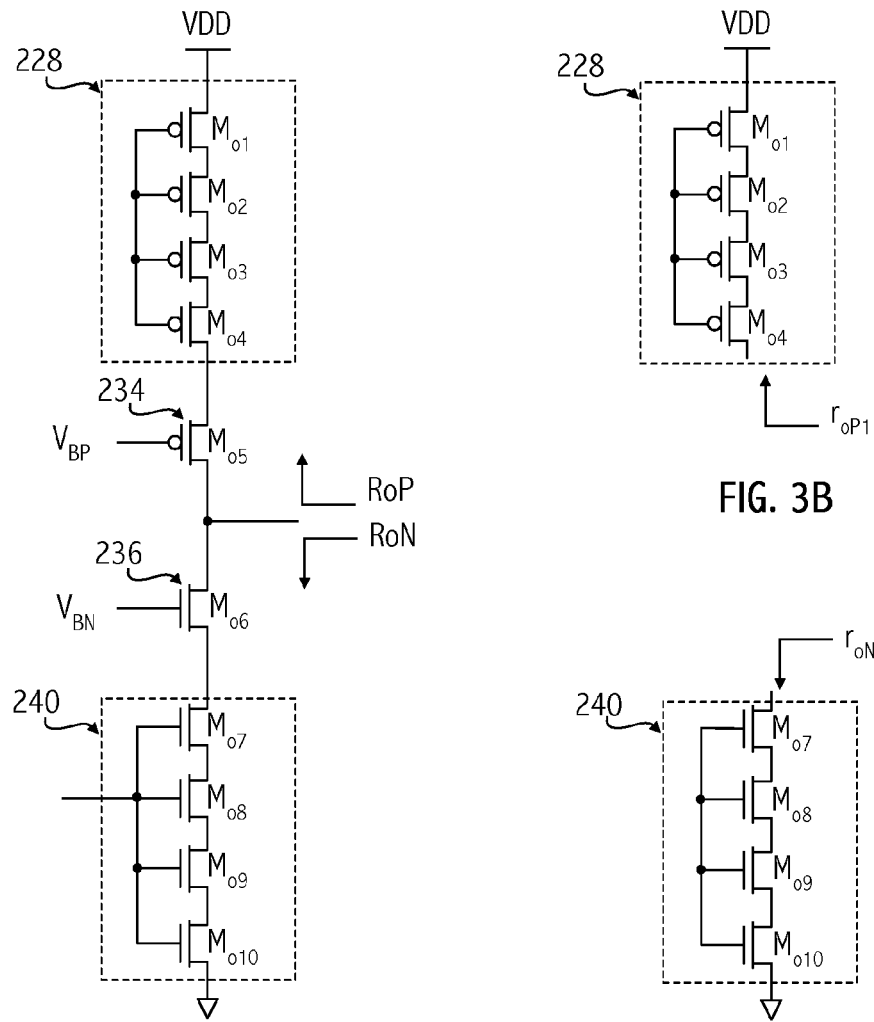
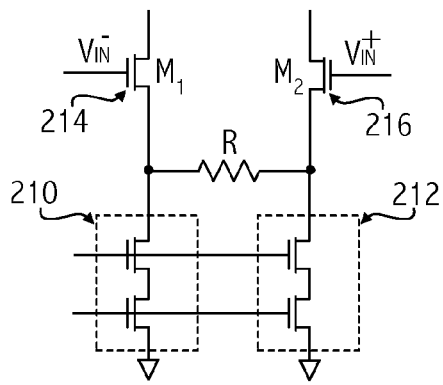
FIG. 3A  FIG. 3C
FIG. 3D

PARTIAL CASCODE IN COMBINATION WITH FULL CASCODE OPERATIONAL TRANSCONDUCTANCE AMPLIFIER

BACKGROUND

1. Field of the Invention

This application is related to integrated circuits and, more particularly, to amplifier circuits.

2. Description of the Related Art

In general, an operational transconductance amplifier (i.e., "unbuffered" operational amplifier) is an amplifier circuit that has a very high output resistance and generates an output current in response to a differential input voltage. Thus, the operational amplifier is a voltage controlled current source (VCCS). In an ideal operational transconductance amplifier, the output current is a linear function of the differential input voltage, i.e., $I_{OUT}=(V_{IN}^+ - V_{IN}^-) \times g_m$, where $V_{IN}^+$ is a voltage at a non-inverting input, $V_{IN}^-$ is a voltage at the inverting input, and $g_m$ is the transconductance of the amplifier. A typical operational amplifier has a high impedance differential input stage and may be used with or without negative feedback. Performance limitations of a typical operational transconductance amplifier include insufficient gain, limited stable bandwidth caused by an inability to control higher-order poles of the operational transconductance amplifier, and poor power-supply rejection.

SUMMARY OF EMBODIMENTS OF THE INVENTION

In at least one embodiment of the invention, an amplifier circuit includes a first stage and a second stage. The first stage includes a differential input circuit coupled to a differential input node. The first stage includes a first partial cascode circuit including devices of a first type, the first partial cascode circuit being coupled to a first power supply node, a first bias node, and the differential input stage. The first stage includes a second partial cascode circuit including devices of a second type, the second partial cascode circuit being coupled to a second power supply node and the differential input circuit. The second stage is coupled to the first stage. The second stage includes a first full cascode circuit coupled to an output node.

In at least one embodiment of the invention, a method includes generating an output current in response to a differential input voltage and associated with an output transconductance. The method includes selectively increasing the output transconductance from a first value to a second value in response to a control signal. A first value of the control signal enables a first partial cascode circuit coupled in parallel to a second partial cascode circuit. A second value of the control signal disables the first partial cascode circuit.

In at least one embodiment of the invention, an amplifier circuit includes a full cascode circuit coupled to an output node. The amplifier circuit includes a first partial cascode circuit coupled to a first node and coupled between the full cascode circuit and a first power supply node. The amplifier circuit includes a second partial cascode circuit coupled to the first node and coupled between the full cascode circuit and the first power supply node. The amplifier circuit includes a switch circuit responsive to a control signal to selectively enable the second partial cascode circuit.

BRIEF DESCRIPTION OF THE DRAWINGS

The present invention may be better understood, and its numerous objects, features, and advantages made apparent to those skilled in the art by referencing the accompanying drawings.

FIGS. 3A, 3B, 3C, and 3D illustrate circuit diagrams of exemplary portions of the operational transconductance amplifier of FIG. 2 consistent with at least one embodiment of the invention.

The use of the same reference symbols in different drawings indicates similar or identical items.

DETAILED DESCRIPTION

Figure 1:
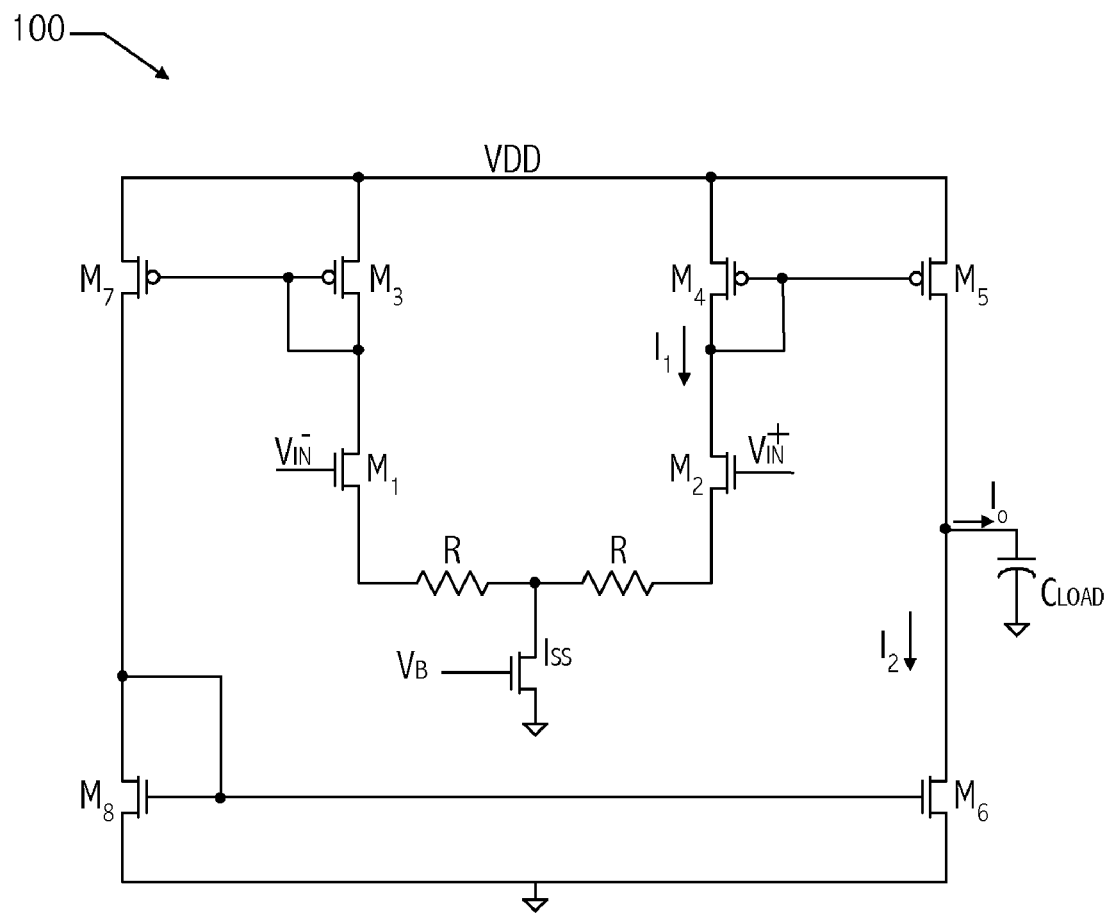
FIG. 1 illustrates a circuit diagram of an exemplary operational transconductance amplifier.

Referring to FIG. 1, an exemplary operational transconductance amplifier (e.g., operational transconductance amplifier 100) drives a capacitive load (e.g., $C_{LOAD}$). The open loop voltage gain, $A_v$, and unity gain bandwidth, $W_o$, of operational amplifier 100 is:

$$I_1 = \frac{g_{m1}}{2}(V_{IN}^- - V_{IN}^+)\frac{I_{SS}}{2}$$

$$I_2 = \frac{g_{m2}}{2}(V_{IN}^+ - V_{IN}^-)\frac{I_{SS}}{2}$$

$$g_m = g_{m1} = g_{m2}$$

$$\Delta V_{IN} = V_{IN}^+ - V_{IN}^-$$

$$I_O = I_1 - I_2 = g_m(\Delta V_{IN})$$

$$g_m = \frac{I_O}{\Delta V_{IN}}$$

$$V_O = I_O \times R_O$$

$$R_O = r_{ds5} \| r_{ds6}$$

$$A_v = \frac{I_O \times R_O}{\Delta V_{IN}}$$

$$A_v = \frac{V_O}{\Delta V_{IN}} = g_m \times (r_{ds5} \| r_{ds6})$$

$$A_v = \frac{V_O}{\Delta V_{IN}} = g_m \times \left((r_{ds5} \| r_{ds6}) \| \frac{1}{C_{LOAD}}\right)$$

$$W_O = \frac{I_O}{\Delta V_{IN} \times C_{LOAD}} = \frac{g_m}{C_{LOAD}}$$

where $I_O$ is the output current, $R_O$ is the output impedance, $V_{IN}^+$ is a voltage at a non-inverting input, $V_{IN}^-$ is a voltage at the inverting input, $r_{ds5}$ and $r_{ds6}$ are the drain-to-source resistances of devices $M_5$ and $M_6$, respectively, $g_{m1}$ is the transconductance of the first stage, and $g_{m2}$ is the transconductance of the second stage, and $g_m$ is the transconductance of operational transconductance amplifier 100.

The open-loop gain of operational transconductance amplifier 100 is insufficient for operational transconductance amplifier 100 to adequately drive a load in some exemplary low-power applications (e.g., a PLL designed in an exemplary 45 nm manufacturing technology having a power supply voltage of approximately 1 V). Accordingly, higher open-loop gain of the operational amplifier would improve performance. Since the open loop gain of operational transconductance amplifier 100 is proportional to the output current and output impedance, the open loop gain may be increased by increasing at least one of the output current and output impedance. However, an increase in the output current increases the open loop bandwidth, which is not desirable in some applications. For example, when an operational transconductance amplifier is coupled to a voltage-controlled oscillator in an exemplary phase-locked loop circuit, an increased open loop bandwidth may decrease the PLL open loop phase margin, which impacts the performance of the PLL. Instead, the open loop gain of the output transconductance amplifier may be increased by increasing the output impedance, $R_O$. However, at low power supply voltages (e.g., approximately 1 V), it may be difficult to increase output impedance while maintaining a relatively wide output signal swing (e.g., approximately 300-700 mV).

A technique for increasing the output impedance of an operational transconductance amplifier includes modifying an output stage of the operational transconductance amplifier to include a full cascode circuit to form a cascode operational transconductance amplifier. As referred to herein, a "full cascode" circuit is a circuit including a common-gate amplifier (e.g., a device in a common-gate configuration, i.e., the gate of the device is coupled to a ground or a bias voltage) and having a source coupled to a drain of a device in a common source configuration. In general, a cascode operational transconductance amplifier offers improved open loop gain, stable bandwidth, and improved power-supply rejection. However, including a full cascode circuit in operational transconductance amplifier 100 may not increase the output impedance, $R_O$, enough to achieve a target open loop gain.

Another approach to increasing the output impedance of an operational transconductance amplifier includes replacing at least some of devices $M_3$, $M_4$, $M_5$, $M_6$, $M_7$ and $M_8$ of operational transconductance amplifier 100 with partial cascode circuits. As referred to herein, a "partial cascode" circuit is a circuit including a plurality of devices of a same type (e.g., n-type or p-type) coupled in series, each in a common source configuration. The gate terminals of the devices are coupled together and coupled to a bias source (e.g., a voltage reference or a current source). Partial cascode circuits may be coupled to power supply voltage nodes, e.g., p-type partial cascode circuits may be coupled to $V_{DD}$, and n-type partial cascode circuits may be coupled to $V_{SS}$. Complementary metal oxide semiconductor (CMOS) devices of a partial cascode stage typically operate in the triode region.

However, inserting partial cascode circuits into operational transconductance amplifier 100 alone may not increase $R_O$ enough to increase the open loop gain to a target value. An operational transconductance amplifier including partial cascode circuits in combination with an output stage having full cascode circuits sufficiently increases the output impedance of the operational transconductance amplifier circuit. Unlike a conventional full cascode topology, in at least one embodiment of an operational transconductance amplifier, a circuit topology that combines a partial cascode circuit topology with a full cascode circuit topology substantially increases the output impedance without substantially reducing output signal swing. In at least one embodiment, that configuration maintains an overhead voltage low enough to provide an acceptable output signal swing, even for manufacturing processes that have decreased device geometries and power supply voltages.

Figure 2:
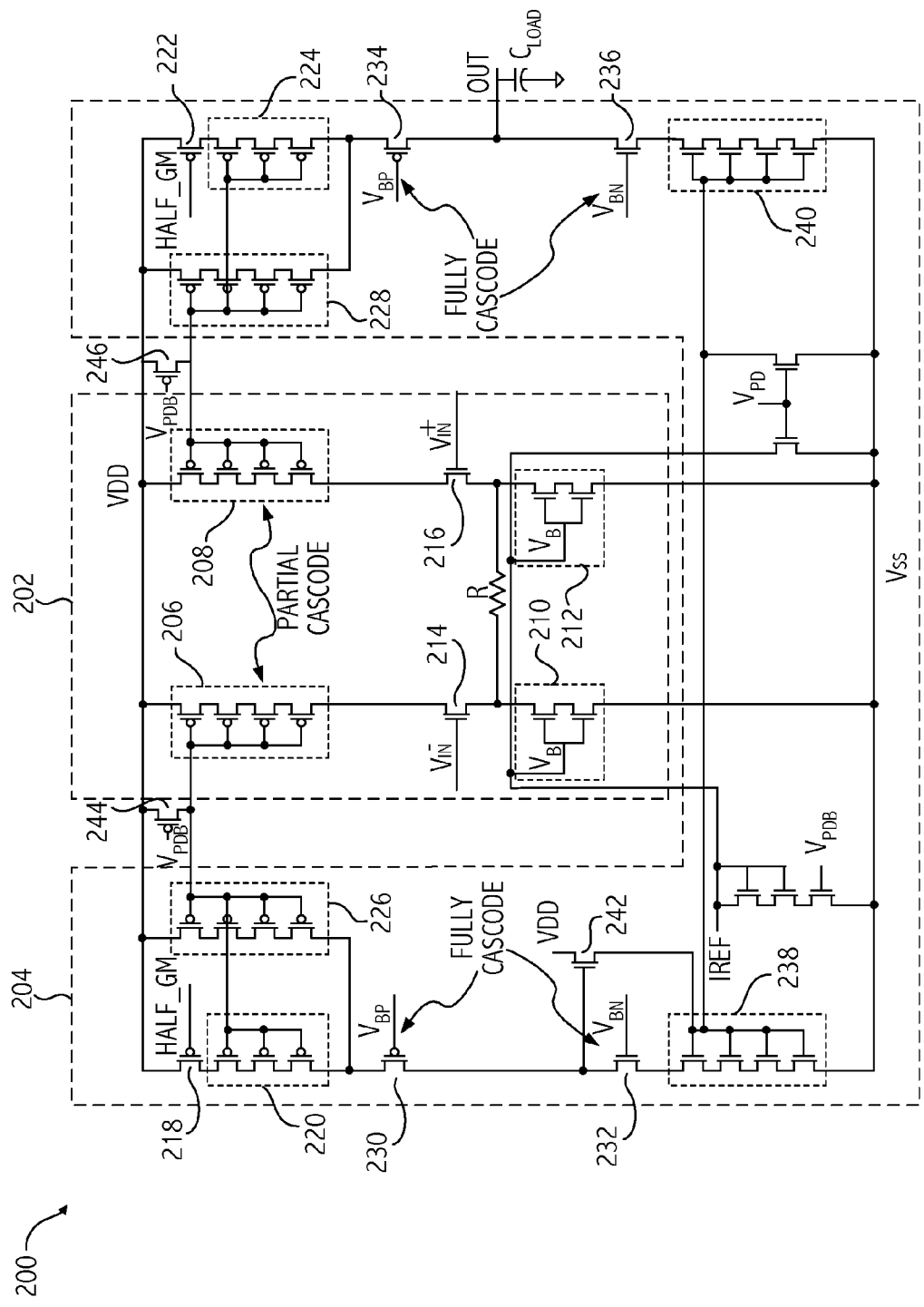
FIG. 2 illustrates a circuit diagram of an operational transconductance amplifier consistent with at least one embodiment of the invention.

Referring to FIG. 2, an exemplary operational transconductance amplifier circuit 200 has an output impedance greater than operational transconductance amplifier circuit 100 and yet, maintains an overhead voltage sufficiently low in order to have an acceptable signal swing (e.g., 300-700 mV for an operational transconductance amplifier implemented in an exemplary 45 nm manufacturing process technology with a power supply voltage of approximately 1 V). Note that the exemplary manufacturing process technology is characterized by lower headroom, significant gate leakage, and shorter device channel lengths.

In at least one embodiment, operational transconductance amplifier 200 includes an input stage (e.g., input stage 202), and an output stage (e.g., output stage 204). Input stage 202 includes a differential input circuit (e.g., the circuit including n-type devices 214 and 216). In at least one embodiment, operational transconductance amplifier 200 includes partial cascode circuits in both input stage 202 and output stage 204 (e.g., p-type partial cascode circuits 206, 208, 220, 224, 226, 228 and n-type partial cascode circuits 210, 212, 238, 240) and full cascode circuits (e.g., p-type devices 230 and 234 and n-type devices 232 and 236) in output stage 204.

In at least one embodiment of an operational transconductance amplifier circuit, partial cascode circuits 206, 208, 226, 228, 238, and 240 each include four devices having a channel length L, coupled in series, rather than each including one device with a channel length of 4 L. In each partial cascode circuit, by stacking N gate-connected devices having a channel length L in series and biasing those devices by the same bias voltage, short channel effects are increased and the output impedance is increased as compared to an embodiment using one device having a channel length N×L. The number of devices stacked in a partial cascode and the number of partial cascode stages used in an operational transconductance amplifier may vary according to application and/or target manufacturing technology.

In at least one embodiment, operational transconductance amplifier 200 has an increased open-loop voltage gain and the same open-loop unity gain bandwidth as compared to operational transconductance amplifier circuit 100 of FIG. 1. The open loop voltage gain, $A_V$, and the open-loop unity gain bandwidth, $W_O$, of operational amplifier 200 are represented as follows:

$$R_{OP} = g_{M05} \times r_{ds05} \times r_{oP1}$$
$$r_{OP1} \approx g_{M04} r_{ds04} \times g_{M03} r_{ds03} \times g_{M02} r_{ds02} \times r_{ds01}$$
$$R_{ON} = g_{M06} \times r_{ds06} \times r_{oN1}$$
$$r_{ON1} \approx g_{M07} r_{ds07} \times g_{M08} r_{ds08} \times g_{M09} r_{ds09} \times r_{ds10}$$
$$R_O = R_{OP} \| R_{ON}$$
$$A_V = g_m \times R_O$$
$$A_V = g_m \times (R_{OP} \| R_{ON})$$
$$W_O = \frac{g_{m1}}{C_{LOAD}}$$

Note that $R_{OP}$ and $R_{ON}$ are resistance values as seen looking into the drain of full cascode p-type device 234 and the drain of full cascode n-type device 236, respectively, as illustrated in FIG. 3A. The resistance value of $r_{OP1}$ is the resistance value seen looking into the drain of p-type device $M_{O4}$ of circuit 228 of FIG. 3B. The resistance value of $r_{ON1}$ is the resistance value seen looking into the drain of n-type device $M_{O7}$ of circuit 240 of FIG. 3C. The transconductance value $g_{m1}$ is the input transconductance of the circuit portion illustrated in FIG. 3D.

In at least one embodiment, an operational transconductance amplifier includes programmability to increase the output transconductance, which results in an increase in the open loop voltage gain, $A_v$, and the unity gain bandwidth, $W_o$. For example, referring back to FIG. 2, operational transconductance amplifier 200 includes circuit portion 224 and device 222, which match the devices of circuit portion 228. A control signal (e.g., HALF_GM) selectively enables circuit portion 224 and device 222 to thereby double the output transconductance, open loop voltage gain, and unity gain bandwidth of operational transconductance amplifier 200. However, in other embodiments (e.g., those that can tolerate or require increased unity gain bandwidth) additional matched circuit portions may be included to increase the transconductance by other multiplier factors.

Devices formed in at least one manufacturing process technology (e.g., 45 nm manufacturing process technology), have substantially high gate leakage as compared to the gate leakage of devices manufactured in other technologies. In at least one embodiment of operational transconductance amplifier 200, device 242 is included to reduce gate leakage by providing a bias voltage from the power supply node (i.e., $V_{DD}$).

Figure 4:
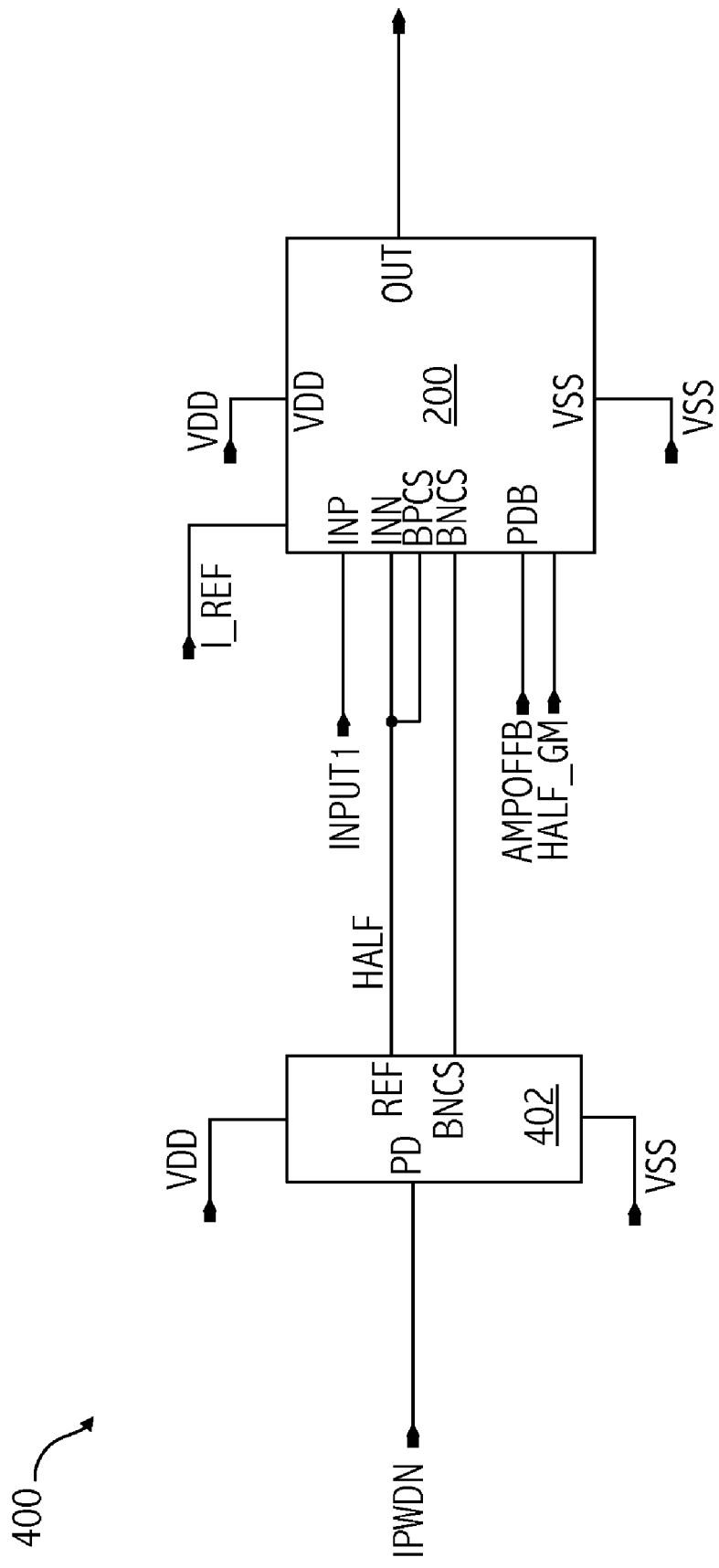
FIG. 4 illustrates a block diagram of the exemplary operational transconductance amplifier of FIG. 2 and biasing circuitry consistent with at least one embodiment of the invention.
Figure 5:
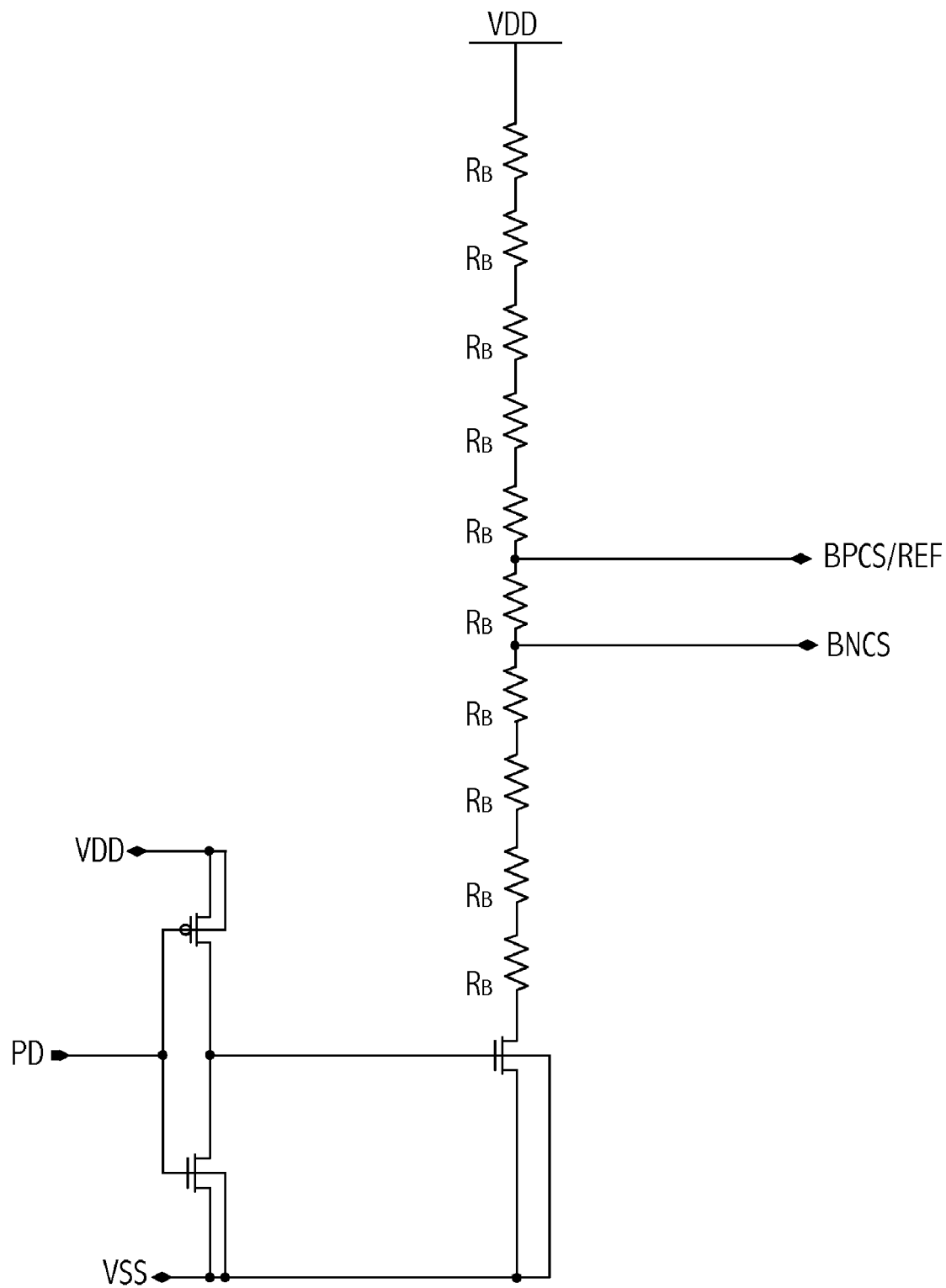
FIG. 5 illustrates a circuit diagram of exemplary biasing circuitry of FIG. 4 consistent with at least one embodiment of the invention.

The circuit topology of operational transconductance amplifier 200 requires two new biasing voltages for the PMOS and NMOS cascoded devices. Referring to FIG. 4, in at least one embodiment, operational transconductance amplifier 200 is coupled to bias circuitry 402, which provides bias voltages BPCS and BNCS. In at least one embodiment of operational transconductance amplifier 200, those biasing voltages are generated using existing circuitry. For example, referring to FIG. 5, biasing voltages of BPCS and BNCS may be achieved using an already present resistor voltage divider circuit that generates a half-$V_{DD}$ input reference (e.g., REF). However other suitable circuits may be used to generate bias voltages. Note that operational transconductance amplifier 200 does not incur a power or area penalty as compared to the operational transconductance amplifier 100 of FIG. 1.

Figure 6:
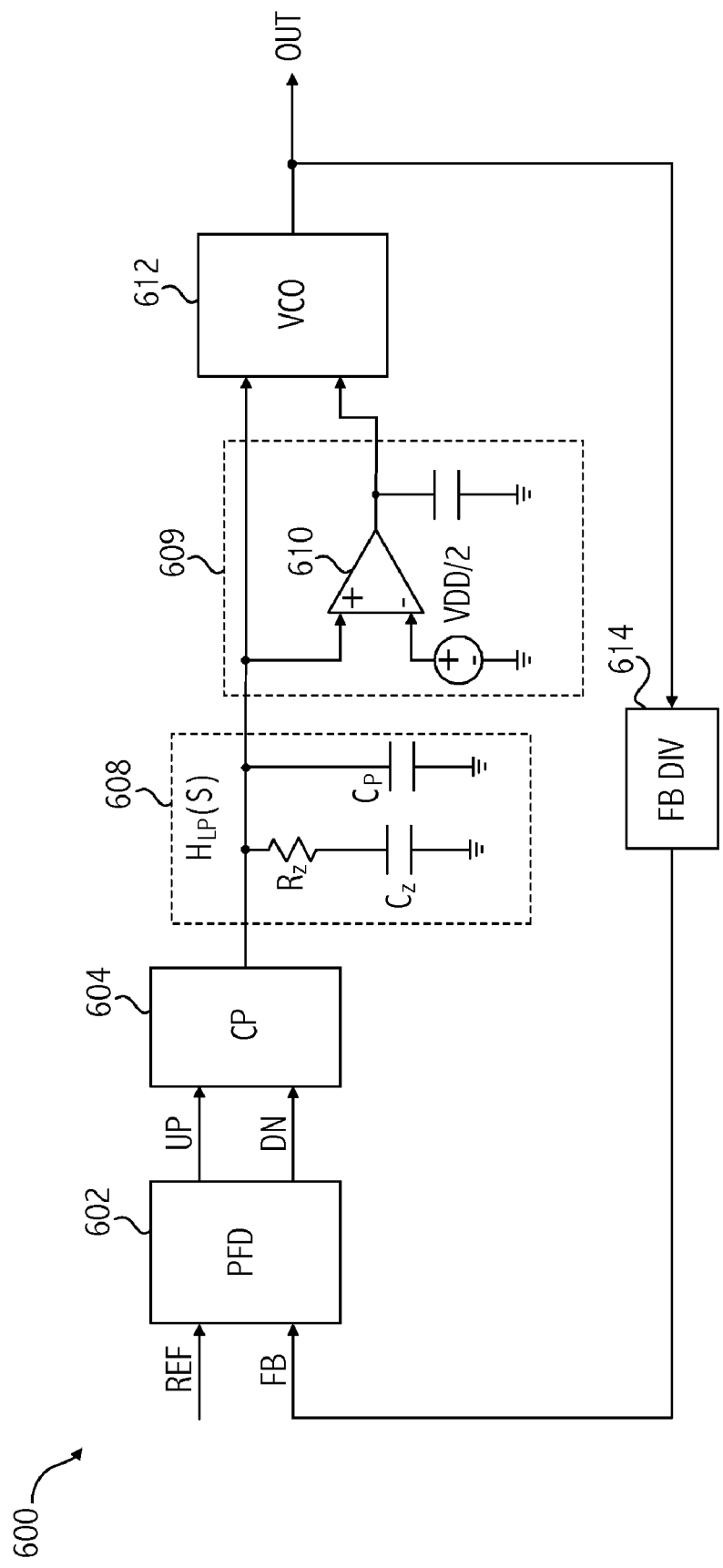
FIG. 6 illustrates a block diagram of a phase-locked loop including the operational transconductance amplifier of FIG. 2 consistent with at least one embodiment of the invention.

Referring to FIG. 6, operational transconductance amplifier 200 may be used in various applications including phase-locked loop (PLL) applications. For example, in an exemplary PLL (e.g., PLL 600), operational transconductance amplifier 200 amplifies an output of loop filter 608 to provide additional gain to voltage controlled oscillator 612. The increased open-loop voltage gain of operational transconductance amplifier 200 results in improved static phase error and reduces input-referred offset error of operational transconductance amplifier 200 as compared to operational transconductance amplifier 100. As a result, PLL 600 has improved static phase error of the tracking of phase frequency detector input. In addition, the charge pump transient mismatching output current improves and charge pump output leakage is more manageable, thus improving long term and short term jitter.

Since the input-referred offset error of the operational transconductance amplifier 200 improves, charge pump output voltage tracks more precisely at a target half-$V_{DD}$ voltage, which, in some embodiments, is the target operating point for the charge pump to achieve minimum output current mismatch. Note that the architecture of PLL 600 is exemplary only, and that operational transconductance amplifier 200 may be used in other portions of PLL 600 (e.g., charge pump 604) or in other PLL architectures to improve the performance of those PLL architectures as compared to PLL architectures that include operational transconductance amplifier 100.

While circuits and physical structures are generally presumed, it is well recognized that in modern semiconductor design and fabrication, physical structures and circuits may be embodied in computer-readable descriptive form suitable for use in subsequent design, test, or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic storage medium.

The description of the invention set forth herein is illustrative, and is not intended to limit the scope of the invention as set forth in the following claims. For example, while the invention has been described with regard to operational transconductance amplifiers, i.e., unbuffered operational amplifiers, one of skill in the art will appreciate that the teachings herein can be utilized with buffered operational amplifiers, i.e., voltage operational amplifiers. In addition, while the invention has been described with regard to a PLL application, one of skill in the art will appreciate that the teachings herein can be utilized in other applications. Variations and modifications of the embodiments disclosed herein, may be made based on the description set forth herein, without departing from the scope and spirit of the invention as set forth in the following claims.

What is claimed is:

1. An amplifier circuit comprising:
 a first stage comprising:
  a differential input circuit coupled to a differential input node;
  a first partial cascode circuit including devices of a first type, the first partial cascode circuit being coupled to a first power supply node, a first node, and the differential input circuit; and
  a second partial cascode circuit including devices of a second type, the second partial cascode circuit being coupled to a second power supply node and the differential input circuit; and
 a second stage coupled to the first stage, the second stage comprising a first full cascode circuit coupled to an output node,
 wherein the first partial cascode circuit comprises a plurality of common-source devices of a first type coupled in series including a plurality of corresponding gate terminals coupled to the first node.

2. The amplifier circuit, as recited in claim 1, wherein the second partial cascode circuit comprises a plurality of common-source devices of a second type coupled in series including a plurality of corresponding gate terminals coupled to a second node.

3. The amplifier circuit, as recited in claim 2, wherein the first node is responsive to a first bias voltage and the second node is responsive to a second bias voltage.

4. The amplifier circuit, as recited in claim 1, wherein the first full cascode circuit comprises a first device of a first type coupled to the output node and a first bias node and a second device of a second type coupled to the output node and a second node.

5. The amplifier circuit, as recited in claim 1, wherein the second stage further comprises a third partial cascode circuit coupled to the first power supply node and the first node.

6. The amplifier circuit, as recited in claim 5, wherein the second stage further comprises:
- a fourth partial cascode circuit coupled to the first node; and
- a select circuit responsive to a control signal to selectively enable the fourth partial cascode circuit.

7. The amplifier circuit, as recited in claim 6, wherein the amplifier circuit has a first transconductance in response to a first value of the control signal and the amplifier has a second transconductance in response to a second value of the control signal, the first value being substantially greater than the second value.

8. The amplifier circuit, as recited in claim 6, wherein the second stage further comprises:
- a second full cascode circuit; and
- a fifth partial cascode circuit including devices of the second type and coupled to the second full cascode circuit and the second power supply node.

9. The amplifier circuit, as recited in claim 8, further comprising:
- a first device coupled to the second full cascode circuit and the fifth partial cascode circuit, wherein the first device has a gate coupled to the second full cascode circuit, a drain coupled to the first power supply node and a source coupled to a gate of a device in the fifth partial cascode circuit.

10. The amplifier circuit, as recited in claim 8, further comprising:
- a sixth partial cascode circuit including devices of the first type and coupled to the first node;
- a second select circuit responsive to the control signal to selectively enable the sixth partial cascode circuit.

11. A method comprising:
- generating an output current in response to a differential input voltage and associated with an output transconductance; and
- selectively increasing the output transconductance from a first value to a second value in response to a control signal,
  wherein a first value of the control signal enables a first partial cascode circuit coupled in parallel to a second partial cascode circuit and a second value of the control signal disables the first partial cascode circuit.

12. The method, as recited in claim 11, wherein the first and second partial cascode circuits include devices of a first type and are coupled to at least one full cascode circuit, a first bias node, and a first power supply node.

13. The method, as recited in claim 12, wherein the at least one full cascode circuit is coupled to a third partial cascode circuit including devices of a second type, the third partial cascode circuit being coupled to a second bias node and a second power supply node.

14. The method, as recited in claim 11, wherein each of the first and second partial cascode circuits comprises a plurality of common-source devices coupled in series and including a plurality of corresponding gate terminals coupled to each other.

15. An amplifier circuit comprising:
- a first stage comprising:
  - a differential input circuit coupled to a differential input node;
  - a first partial cascode circuit including devices of a first type, the first partial cascode circuit being coupled to a first power supply node, a first bias node, and the differential input circuit; and
  - a second partial cascode circuit including devices of a second type, the second partial cascode circuit being coupled to a second power supply node and the differential input circuit; and
- a second stage coupled to the first stage, the second stage comprising a first full cascode circuit coupled to an output node,
  wherein the first full cascode circuit comprises a device in a common gate configuration having a source coupled to a drain of another device in a common source configuration.

* * * * *